(12) United States Patent
Kim

(10) Patent No.: US 7,868,371 B2
(45) Date of Patent: Jan. 11, 2011

(54) NON-VOLATILE MEMORY DEVICE AND FABRICATION METHOD THEREOF

(75) Inventor: Myoung-Soo Kim, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 262 days.

(21) Appl. No.: 12/136,580

(22) Filed: Jun. 10, 2008

(65) Prior Publication Data

US 2009/0014766 A1    Jan. 15, 2009

(30) Foreign Application Priority Data

Jul. 9, 2007    (KR) .................. 10-2007-0068827

(51) Int. Cl.
*H01L 27/108*    (2006.01)
(52) U.S. Cl. .............. 257/298; 257/315; 257/316; 257/317; 257/320; 257/324
(58) Field of Classification Search .............. None
See application file for complete search history.

(56) References Cited

U.S. PATENT DOCUMENTS

2003/0015754 A1    1/2003    Fukumoto et al.

2004/0238873 A1*   12/2004   Koo et al. ................. 257/314

FOREIGN PATENT DOCUMENTS

| JP | 2003-031703 | 1/2003 |
| JP | 2004-356580 | 12/2004 |
| KR | 2004-0101657 | 12/2004 |
| KR | 2005-0095430 | 9/2005 |

OTHER PUBLICATIONS

English language abstract of Japanese Publication No. 2003-031703.
English language abstract of Japanese Publication No. 2004-356580.
English language abstract of Korean Publication No. 2004-0101657.
English language abstract of Korean Publication No. 2005-0095430.

* cited by examiner

*Primary Examiner*—N Drew Richards
*Assistant Examiner*—Kyoung Lee
(74) *Attorney, Agent, or Firm*—Muir Patent Consulting, PLLC

(57) ABSTRACT

In one embodiment, a non-volatile memory device includes an isolation film defining an active region in a semiconductor substrate; a tunnel insulating film located on the active region; a control gate located on the isolation film; an inter-gate dielectric film parallel to the control gate and located between the control gate and the isolation film; an electrode overlapped by the control gate and the inter-gate dielectric film, wherein the electrode extends over the tunnel insulating film on the active region to form a floating gate; and a source region and a drain region formed in the active region on both sides of the floating gate.

9 Claims, 8 Drawing Sheets

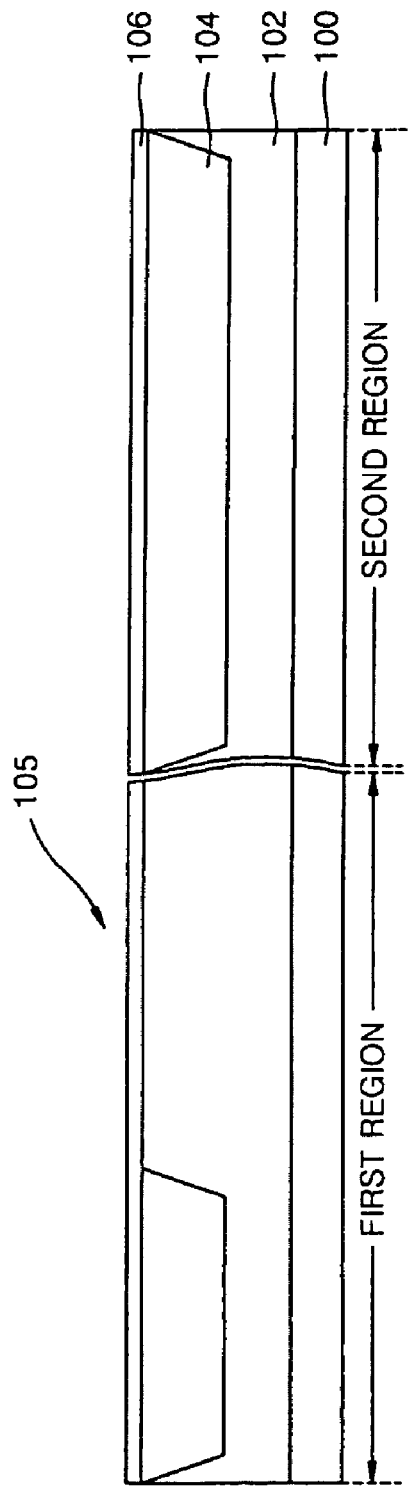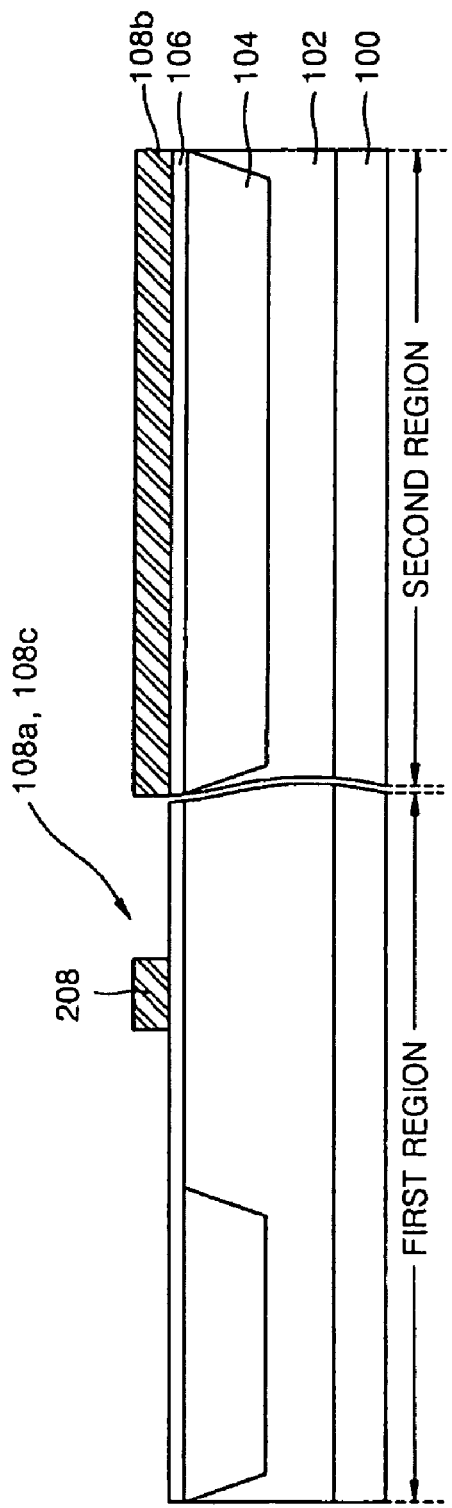

NON-VOLATILE MEMORY DEVICE AND FABRICATION METHOD THEREOF

CROSS-REFERENCE TO RELATED PATENT APPLICATION

This application claims the benefit of foreign priority to Korean Patent Application No. 10-2007-0068827, filed on Jul. 9, 2007, the disclosure of which is incorporated herein in its entirety by reference.

BACKGROUND

1. Field of Invention

Embodiments of the present invention relate generally to semiconductor devices and methods of manufacturing semiconductor devices, and more particularly, to a non-volatile memory device and a method of manufacturing the non-volatile memory device.

2. Description of the Related Art

Generally, non-volatile memory devices keep data when power is turned off and can be selectively programmed as required by the user. Memory devices such as one-time programmable (OTP) memory devices or multi-time programmable (MTP) memory devices can be used for one-time or multiple-time programming. Thus, demand for such memories is gradually increasing.

The values of non-volatile memory devices are not the characteristic feature of the non-volatile memory devices, but the assisting function to various semiconductor products. For example, OTP and MTP memory devices can be embedded in an integrated circuit (e.g., a display driver IC (DDI), an LCD driver (LDI), etc.) and be used to record information. Thus, OTP and MTP memory devices have a small memory capacity.

Cells of a conventional memory device have a stack-type structure in which a tunneling oxide film, a floating gate, a dielectric film, and a control gate are sequentially formed on a semiconductor substrate, and in which a source and drain are formed in the semiconductor substrate on both sides of the control gate. A memory device having such a stack-type structure operates by changing a threshold voltage of the cells while electrons are moving towards the tunneling oxide due to a strong electric field. However, since the cells of the memory device have a stack-type structure, additional processes are required to embed the stack in an integrated circuit. Thus, the number of manufacturing process required to form the integrated circuit is increased and the process of forming memory device becomes complicated, thereby increasing manufacturing costs.

Conventional memory devices typically require a capacitor. Conventionally, capacitors are formed by sequentially forming a dielectric film and a doped polysilicon film serving as an upper electrode on a doped polysilicon film serving as a lower electrode. If these processes for forming the capacitor are added, the manufacturing cost of non-volatile memory devices that require a small memory capacity as described above can be increased further. As a result, manufacturing costs can be undesirably increased while greatly reducing productivity.

SUMMARY

To address the above and/or other problems, embodiments of the present invention can be characterized as capable of providing a non-volatile memory device with a modified cell structure and a capacitor manufactured with a simple process without needing an additional process.

One exemplary embodiment disclosed herein can be generally characterized as a non-volatile memory device that includes: an isolation film defining an active region in a semiconductor substrate; a tunnel insulating film located on the active region; a control gate located on the isolation film; an inter-gate dielectric film parallel to the control gate and located between the control gate and the isolation film; an electrode overlapped by the control gate and the inter-gate dielectric film, wherein the electrode extends over the tunnel insulating film on the active region to form a floating gate; and a source region and a drain region formed in the active region on both sides of the floating gate.

Another exemplary embodiment disclosed herein can be generally characterized as a non-volatile memory device that includes a semiconductor substrate; an access transistor; and a capacitor. The access transistor may include a tunnel insulating film on the substrate; a floating gate formed on the tunnel insulating film; an inter-gate dielectric film on the floating gate; and a control gate on the inter-gate dielectric film, wherein the control gate controls the floating gate. The capacitor may include a capacitor lower electrode on the substrate, wherein the capacitor lower electrode and the floating gate comprise the same film; a capacitor dielectric layer on the capacitor lower electrode, wherein the capacitor dielectric layer and the inter-gate dielectric film comprise the same film; and a capacitor upper electrode on the capacitor dielectric layer, wherein the capacitor upper electrode and the control gate comprise the same film. The capacitor lower electrode and the capacitor upper electrode may constitute a spread capacitor structure.

Yet another exemplary embodiment disclosed herein can be generally characterized as a non-volatile memory device that includes an access transistor; a select transistor; and a capacitor. The access transistor may include a tunnel insulating film formed on a semiconductor substrate; a floating gate formed on the tunnel insulating film; and a source region and a first drain region formed on both sides of the floating gate. The select transistor may include a first gate insulating film formed on the semiconductor substrate; a select gate formed on the first gate insulating film, wherein the select gate is structurally adjacent to the access transistor; and a second drain region formed on a side of the select gate, wherein the source region is formed on another side of the select gate such that the source region is shared by the access transistor and the select transistor. The capacitor may include a protective insulating film formed on the semiconductor substrate; a capacitor lower electrode formed on the protective insulating film, wherein the capacitor lower electrode comprises the same film as the floating gate of the access transistor; a capacitor dielectric film formed on the capacitor lower electrode; and a capacitor upper electrode formed on the capacitor dielectric film.

BRIEF DESCRIPTION OF THE DRAWINGS

The above and other features and advantages of embodiments of the present invention will become more apparent with reference to the attached drawings in which:

FIGS. 8 through 13 are cross-sectional views illustrating a method of manufacturing a non-volatile memory device according to an embodiment of the present invention.

DETAILED DESCRIPTION

Figure 1:
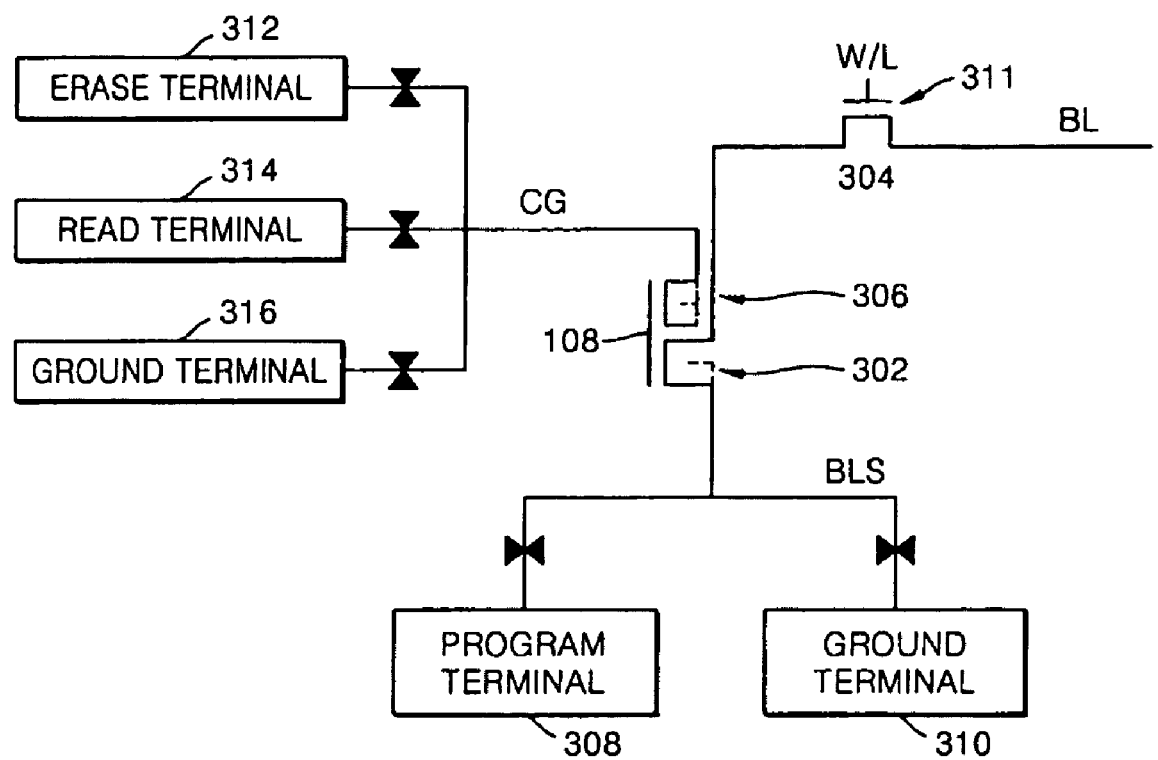
FIG. 1 is a basic circuit diagram of a memory cell of a non-volatile memory device having a capacitor according to an embodiment of the present invention.

Exemplary embodiments of the present invention will now be described more fully with reference to the accompanying drawings. These embodiments may, however, be realized in many different forms and should not be construed as being limited to the embodiments set forth herein; rather, these embodiments are provided so that this disclosure will be thorough and complete, and will fully convey the concept of the invention to those skilled in the art.

In the drawings, the thicknesses of layers and regions are exaggerated for clarity. Like reference numerals in the drawings denote like elements, and thus their description will be omitted. An n-type embodiment will be described later. However, theoretically, a conductive type embodiment opposite to the n type embodiment is also possible. The present invention is not limited to the embodiments set forth herein, and people of ordinary skill in the art can change in form and various ways without departing from the spirit and scope of the present invention. Also, a source region and a drain region are interchangeable, that is, the source region can be the drain region, and vice versa.

FIG. 1 is a basic circuit diagram of a memory cell of a non-volatile memory device having a capacitor according to an embodiment of the present invention.

The cell of the non-volatile memory device according to the present embodiment can be applied to an OTP or MTP memory device. Also, the cell of the non-volatile memory device can be embedded in an integrated circuit, for example, a display driver IC (DDI) or an LCD driver IC (LDI). In FIG. 1, for convenience of explanation, a MTP memory device is shown.

The cell of the non-volatile memory device of FIG. 1 includes an access transistor 302 (A/T), a select transistor 304, and a capacitor 306. An end BLS of the access transistor 302 can be connected to a program terminal 308 or to a ground terminal 310. The select transistor 304 selects the access transistor 302. An end of the select transistor 304 is connected to a bit line (BL) and a gate electrode of the select transistor 304 is connected to a word line (W/L). A control gate CG is connected to an erase terminal 312, a read terminal 314 and a ground terminal 316.

A first electrode 108 functions as a floating gate of the access transistor 302 and as a capacitor lower electrode of the capacitor 306. A second electrode (see FIG. 2 at 120c) functions as the control gate (CG) of the access transistor 302 and as a capacitor upper electrode of the capacitor 306. As a result, the floating gate of the access transistor 302 and the capacitor lower electrode of the capacitor 306 may include the first electrode 108. Similarly, the control gate CG of the access transistor 302 and the capacitor upper electrode of the capacitor 306 may include the second electrode.

In one embodiment, the cell of the non-volatile memory device programs or erases data by increasing or reducing a threshold voltage of the access transistor 302 by applying an appropriate voltage to the program terminal 308 and the erase terminal 312 when the select transistor 304 is on. In another embodiment, the cell of the non-volatile memory device performs a reading operation after detecting an on/off state of the access transistor 302 by applying an appropriate voltage to the read terminal 314.

Figure 2:
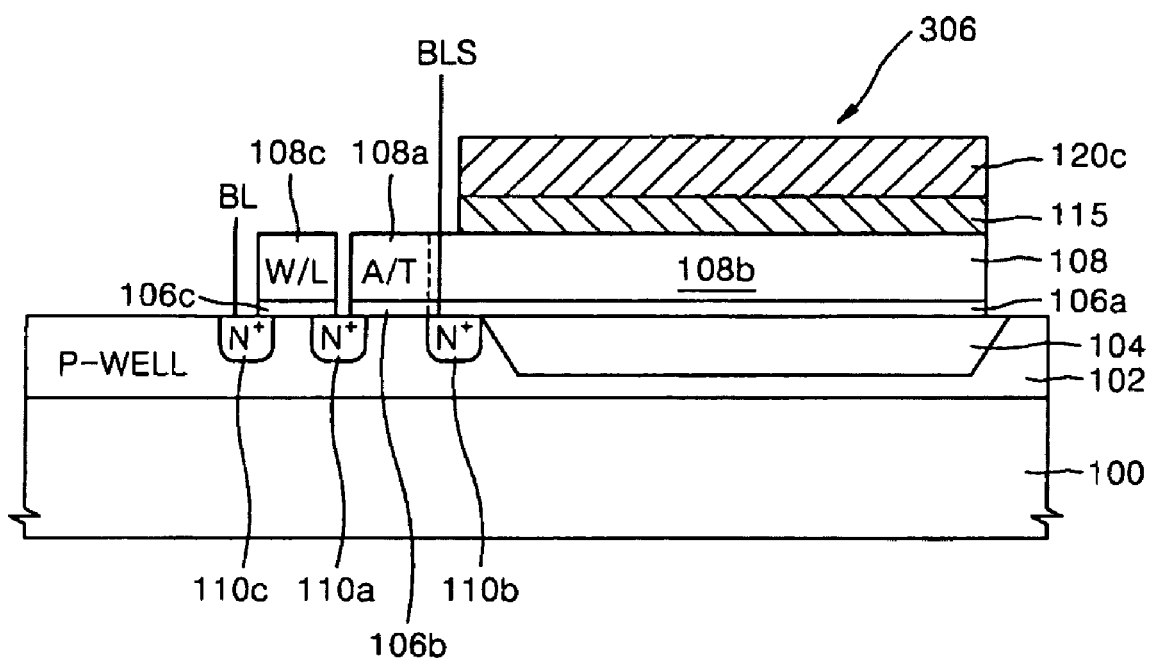
FIG. 2 is a cross-sectional view of a cell structure of the non-volatile memory device of FIG. 1.

FIG. 2 is a cross-sectional view of a cell structure of the non-volatile memory device of FIG. 1.

As exemplarily shown in FIG. 2, the access transistor 302 included in the cell of the non-volatile memory device includes: a first portion 108a of the first electrode 108 on a first portion 106b of an insulating film 106, which is formed on the semiconductor substrate 100; a source region 110a and a first drain region 110b formed on both sides of the first portion 108a of the first electrode 108; and the second electrode 120c on a p-well region 102 of a semiconductor substrate 100. Due to its location relative to the source region 110a and the first drain region 110b, the first portion 108a of the first electrode 108 is also referred to herein as a "floating gate 108a." Due to its location below the floating gate 108a, the first portion 106b of the insulating film 106 is also referred to herein as a "tunnel insulating film 106b."

The select transistor 304 includes: a select gate 108c (W/L) which is structurally adjacent to the access transistor 302 and is formed on a first gate insulating film 106c, which is formed on the semiconductor substrate 100; and the source region 110a and a second drain region 110c formed on both sides of the select gate 108c. In the illustrated embodiment, the select transistor 304 and the access transistor 302 share the source region 110a.

The capacitor 306 includes: a second portion 108b of the first electrode 108 on a second portion 106a of the insulating film 106, which is formed on the semiconductor substrate 100; a dielectric film 115 formed on the second portion 108b of the first electrode 108; and a second electrode 120c formed on the dielectric film 115. The second portion 108b of the first electrode 108 is also referred to herein as a "capacitor lower electrode 108b." Due to its location below the capacitor lower electrode 108b, the second portion 106a of the insulating film 106 is also referred to herein as a "protective insulating film 106a."

In view of the above, the capacitor lower electrode 108b of the capacitor 304 and the floating gate 108a of the access transistor 302 may both include the first electrode 108. The second electrode 120c may be referred to as the control gate (CG) of the access transistor 302 or a capacitor upper electrode of the capacitor 306, depending on other structures that are described in conjunction with the second electrode 120c. Similarly, dielectric film 115 may be referred to as an "intergate dielectric film" of the access transistor 302 or a "capacitor dielectric film" of the capacitor 306, depending on other structures that are described in conjunction with the dielectric film 115.

In one embodiment, the capacitor 306 may be provided as a MIP-type capacitor, wherein the capacitor upper electrode 120c includes a metal layer (M), the capacitor dielectric film 115 includes an insulating layer (I), and the capacitor lower electrode 108b includes a polysilicon layer (P) doped with an impurity. Thus, the non-volatile memory device according to one embodiment may include a MIP capacitor 306. In FIG. 2, reference numeral 104 refers to an isolation film.

Figure 3:
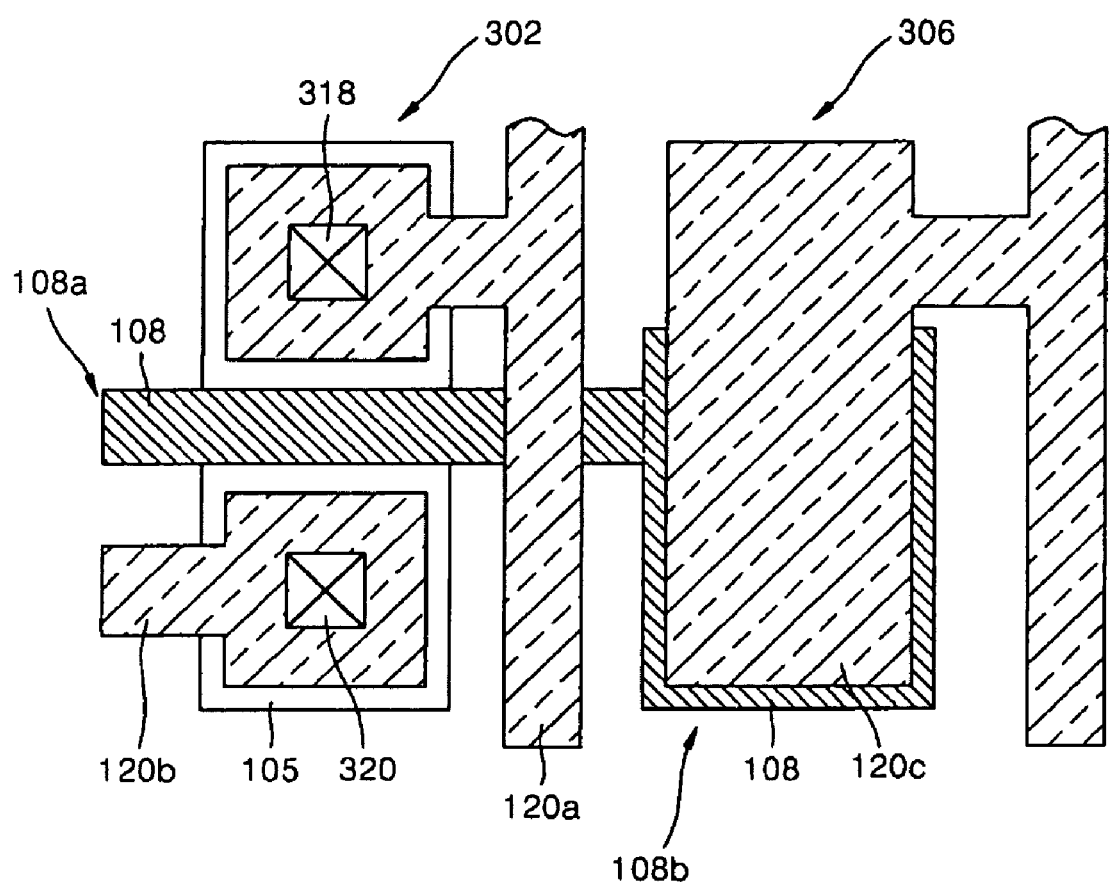
FIG. 3 is a schematic layout view of a cell of a non-volatile memory device according to an embodiment of the present invention.

FIG. 3 is a schematic layout view of a cell of a non-volatile memory device according to an embodiment of the present invention.

More specifically, FIG. 3 illustrates an exemplary layout of the access transistor 302 and the capacitor 306 of the non-volatile memory device. In the illustrated embodiment, the first electrode 108 is configured to have a "T" shape including a leg portion and a head portion. In one embodiment, the floating gate 108a of the access transistor 302 constitutes the leg portion of the "T" shape and the capacitor lower electrode 108b of the capacitor 306 constitutes the head portion of the "T" shape. Thus, the leg portion of the "T" shape overlaps the tunnel insulating film 106b (not shown) and the head portion of the "T" shape overlaps the protective insulating film 106a (not shown).

A source region (not shown) and a drain region (not shown) are positioned in an active region 105 at opposite sides of the floating gate 108a. A source line 120a and a drain line 120b are connected to the source region and the drain region through contacts 318 and 320, respectively. The aforementioned dielectric film 115 (not shown) overlaps the head portion of the "T" shaped first electrode 108.

The capacitor 306 is configured such that a capacitor dielectric film 115 (not shown) is formed on the capacitor lower electrode 108b and such that a capacitor upper electrode 120c is formed on the capacitor dielectric film 115.

Figure 4:
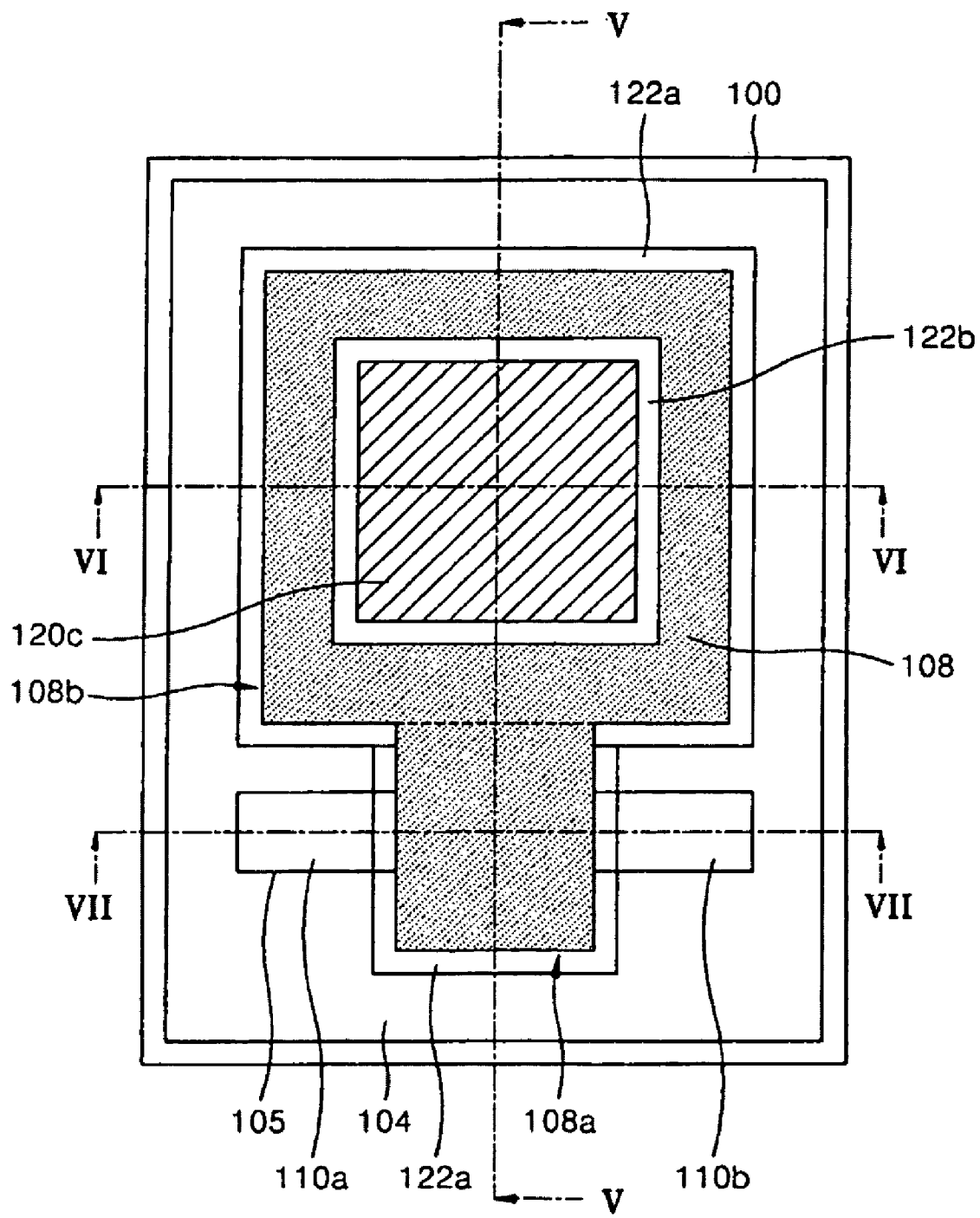
FIG. 4 is a schematic layout view of the cell of the non-volatile memory device of FIG. 3.
Figure 5:
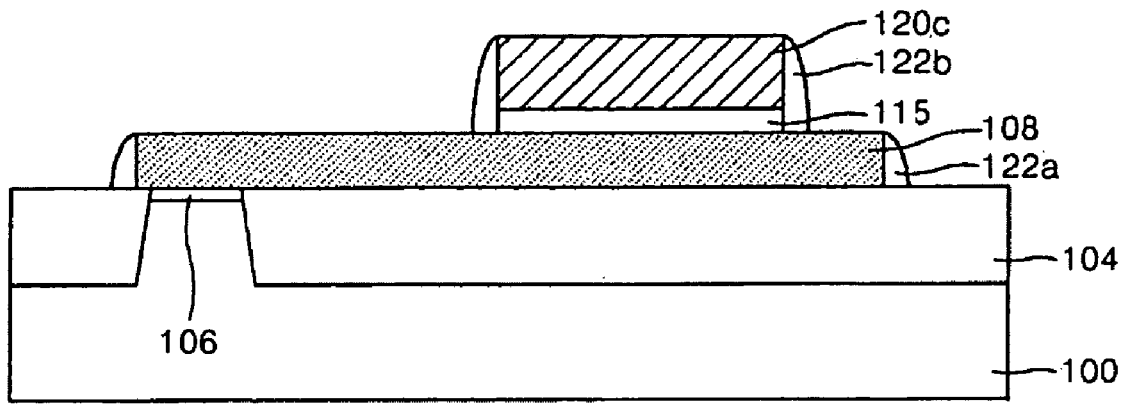
FIG. 5 is a cross-sectional view taken along line V-V of FIG. 4.
Figure 6:
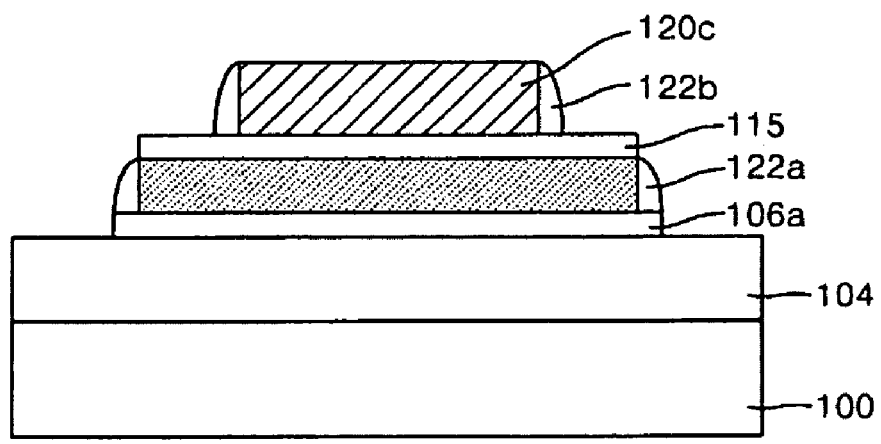
FIG. 6 is a cross-sectional view taken along line VI-VI of FIG. 4.
Figure 7:
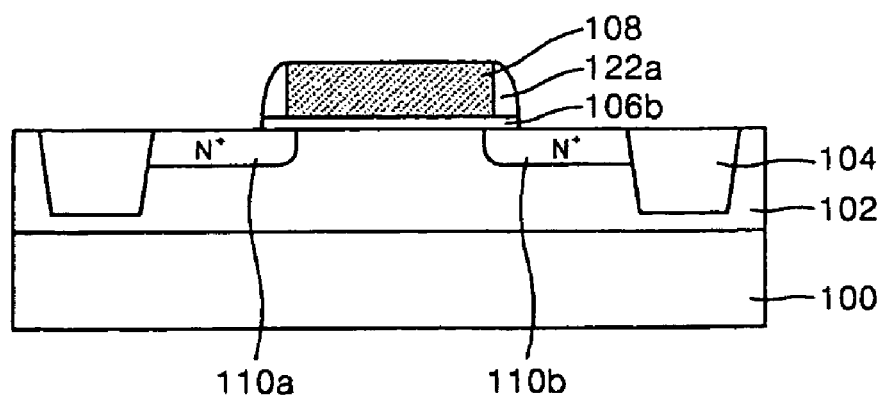
FIG. 7 is a cross-sectional view taken along line VII-VII of FIG. 4.

FIG. 4 is a schematic layout view of the cell of the non-volatile memory device of FIG. 3. FIGS. 5, 6, and 7 are cross-sectional views respectively taken along lines V-V, VI-VI, and VII-VII, respectively, of FIG. 4.

Referring to FIGS. 4 through 7, the first electrode 108 has a "T" shape in which the head portion is relatively wide along a horizontal direction and the leg portion is relatively narrow along the horizontal direction. The isolation film 104 defining the active region 105 of the semiconductor substrate 100 is formed. The tunnel insulating film 106b is formed on the active region 105 of the semiconductor substrate 100. The second electrode 120c is formed on the isolation film 104. The dielectric film 115, which is parallel to the second electrode 120c, is formed between the second electrode 120c and the isolation film 104.

The first electrode 108 is overlapped by the second electrode 120c, is under the dielectric film 115 and extends contiguously from a location over the isolation film 104 to a location over the tunnel insulating film 106b on the active region 105. Accordingly, the head portion of the "T"-shaped first electrode 108 overlaps the isolation film 104 and the leg portion "T"-shaped first electrode 108 overlaps the active region 105. The head portion of the "T"-shaped first electrode 108 (i.e., the capacitor lower electrode 108b) overlaps a protective insulating film 106a and the leg portion "T"-shaped first electrode 108 (i.e., the floating gate 108a) overlaps the tunnel insulating film 106b. The source region 110a and the drain region 110b are formed in the active region 105 on both sides of the floating gate 108a. In FIGS. 4 through 7, reference numerals 122a and 122b indicate spacers.

Referring specifically to FIG. 7, which is a cross-sectional view corresponding to the access transistor shown in FIG. 4, the source region 110a and the drain region 110b are formed on both sides of the stack of the floating gate 108a and the tunnel insulating film 106b. Thus, the resultant structure forms a transistor. Referring specifically to FIG. 6, which is a cross-sectional view corresponding to the capacitor shown in FIG. 4, the capacitor dielectric film 115 and the capacitor upper electrode 120c are positioned on the capacitor lower electrode 108b. Thus, the resultant structure forms the capacitor 306.

Referring to FIGS. 4 and 6, the capacitor lower electrode 108b of the capacitor 306 spreads adjacent to the aforementioned transistor, and the capacitor upper electrode 120c is formed on the spread capacitor lower electrode 108b. In this respect, the non-volatile memory device according to an embodiment of the present invention can be characterized as including a spread capacitor structure in which the capacitor lower electrode 108b and the capacitor upper electrode 120c are spread. If a PIM-type capacitor is used in a semiconductor product into which the non-volatile memory device of the above structure is inserted, the film under the dielectric film 115 is used as a floating gate of a transistor and the film over the dielectric film 115 is used as a control gate of the transistor.

Thus, in the non-volatile memory device according to embodiments of the present invention, the floating gate 108a and the capacitor lower electrode 108b can be simultaneously formed upon forming the first electrode 108, and the capacitor upper electrode and the control gate CG can be simultaneously formed upon forming the second electrode 120c. Thus, a manufacturing process of a non-volatile memory device can be simplified. Furthermore, in the non-volatile memory device according to embodiments of the present invention, a coupling ratio between the control gate 120c and the floating gate 108a of the access transistor 302 corresponds to the capacitor area of the capacitor 306 connected to the floating gate 108a of the access transistor 302.

FIGS. 8 through 13 are cross-sectional views illustrating a method of manufacturing a non-volatile memory device according to an embodiment of the present invention.

In FIGS. 8 through 13, the first region refers to a region where one or more transistors such as the access transistor 302 and/or the select transistor 304 is/are formed, and the second region refers to a region where the capacitor 306 is formed.

Referring to FIG. 8, a p-well 102 is formed in a semiconductor substrate 100 (e.g., a silicon substrate). Next, an active region 105 is defined by forming an isolation film 104 as an isolation structure. Any appropriate isolation method can be used according to the integration density and characteristics of the device. In one embodiment, the isolation structure is a shallow trench isolation (STI) structure provided by forming a groove in the isolation region of the semiconductor substrate 100 followed by burying an insulating film in the groove. It will be appreciated, however, that the isolation film 104 according to the present invention is not limited to STI and that a local oxidation of silicon (LOCOS) isolation structure can be used.

An insulating film 106 is formed on the semiconductor substrate 100. In one embodiment, the insulating film 106 can include an oxide. In another embodiment, the insulating film 106 can be formed by thermally oxidizing the semiconductor substrate 100, by using a deposition method such as low pressure chemical vapor deposition (LPCVD), or the like or a combination thereof. The insulating film 106 is subsequently used as the tunnel insulating film 106b or the gate insulating film 106c in the first region, and is subsequently used as the protective insulating film 106a in the second region. In FIGS. 9 through 13, for convenience of explanation, such insulating films are generally referred to as an insulating film 106.

Referring to FIG. 9, a gate 208 is formed in the first region, and a capacitor lower electrode 108b is formed in the second region. In one embodiment, the gate 208 and the capacitor lower electrode 108b are simultaneously formed (e.g., in one manufacturing process). In one embodiment, the illustrated gate 208 may be the floating gate 108a of the access transistor 302 or the select gate 108c of the select transistor 304. Thus, although the gate 208 and the capacitor lower electrode 108b are illustrated in FIG. 9 as not being connected to each other, it will be appreciated that the gate 208 and the capacitor lower electrode 108b may be connected to each other.

The gate 208 and the capacitor lower electrode 108b may include a material such as polysilicon doped with an impurity. The polysilicon can be formed by depositing silicon at a temperature of about 500° C. to about 700° C. using an LPCVD method. In one embodiment, the polysilicon material can be deposited in an undoped state, and then doped with As or P impurities using, for example, ion implantation method. In another embodiment the polysilicon material can be doped in-situ during deposition. The gate 208 and the capacitor lower electrode 108b can be formed to have a thickness of about 1000 Å to about 2000 Å.

Figure 10:
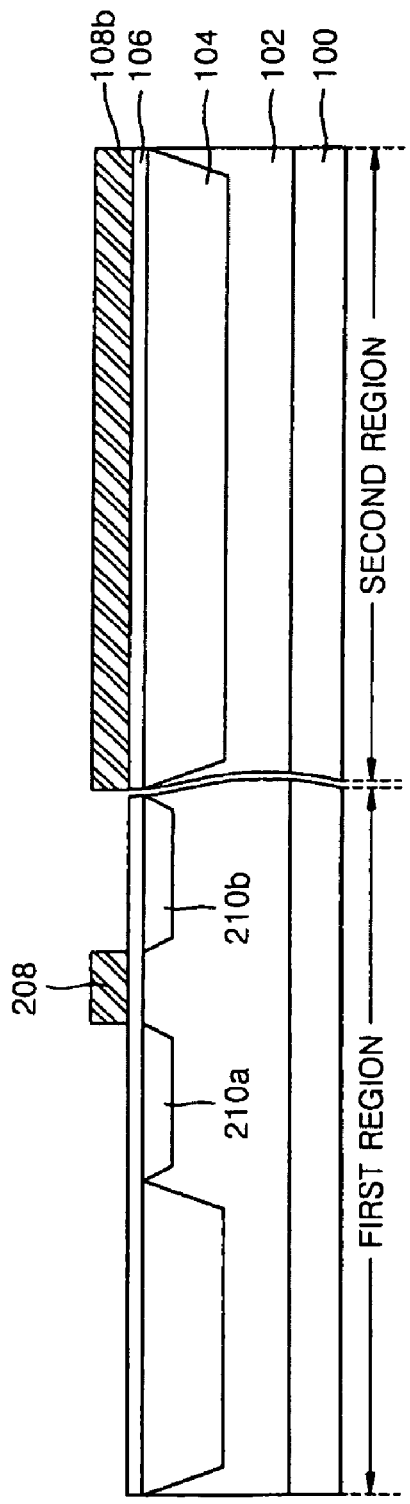

Referring to FIG. 10, a source region 210a and a drain region 210b are formed in the semiconductor substrate 100 on both sides of the gate 208. The source region 210a and the drain region 210b are the source region or the drain region of the access transistor 302 or the select transistor 304 described above.

Figure 11:
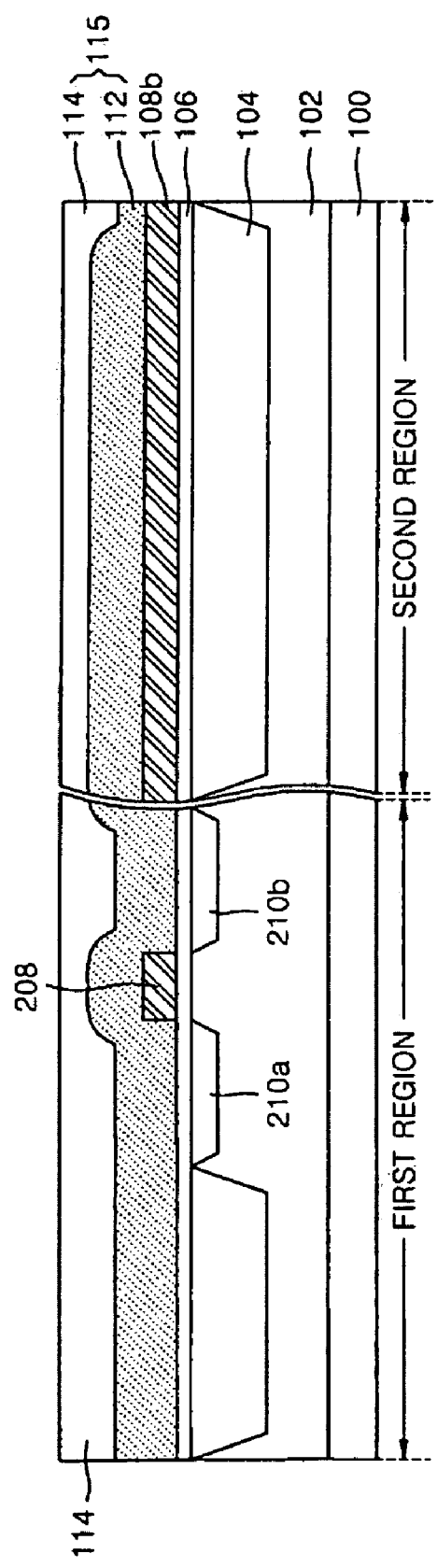
Figure 12:
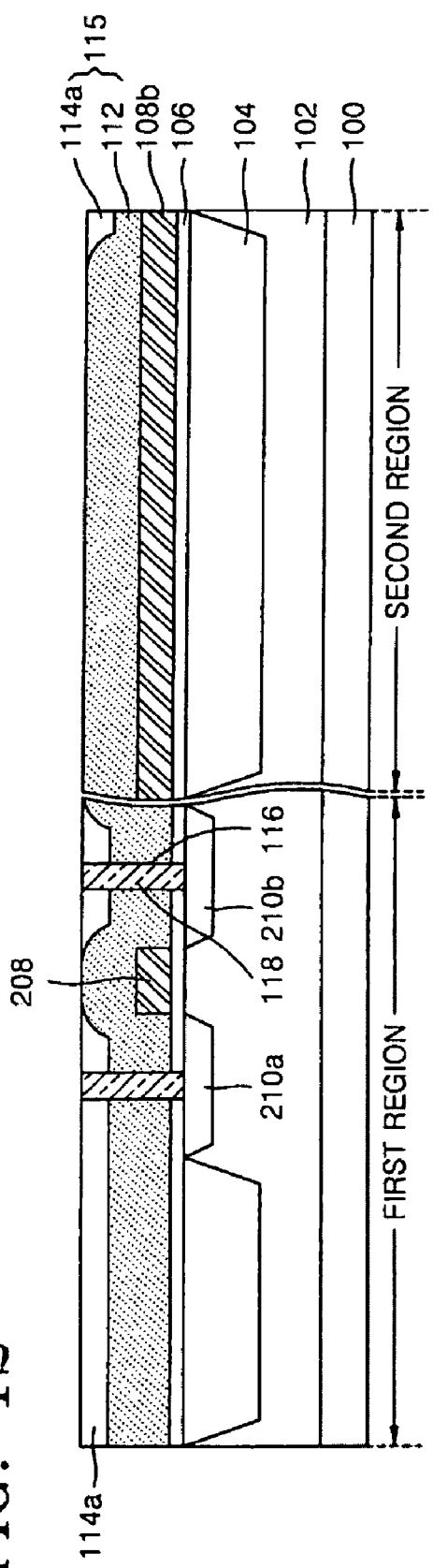

Referring to FIGS. 11 and 12, a dielectric film 115 is formed on the semiconductor substrate 100 on which the gate 208 and the capacitor lower electrode 108b are formed. In one embodiment, the dielectric film 115 may be provided as an interlayer insulating layer. In another embodiment, the dielectric film 115 may be formed of different films.

For example, as depicted in FIG. 11, the dielectric film 115 may include a first interlayer insulating film 112 formed above the semiconductor substrate 100 on which the gate 208 and the capacitor lower electrode 108b are formed. The first interlayer insulating film 112 includes a material that can be etched faster than a subsequently formed second interlayer insulating film 114. For example, the first interlayer insulating film 112 includes a material such as borophosphosilicate glass (BPSG), formed to a thickness of about 500 Å to about 4000 Å. The second interlayer insulating film 114 is formed on the first interlayer insulating film 112. The second interlayer insulating film 114 may include material such as plasma tetra-ethyl orthosilicate (PTEOS oxide), formed to a thickness of about 1000 Å to about 10000 Å.

Referring to FIG. 12, the second interlayer insulating film 114 is planarized to expose a portion of the first interlayer insulating film 112 in the second region where a capacitor is to be formed. The planarizing can be performed using, for example, a chemical mechanical polishing process. As a result, the dielectric film 115 includes the first interlayer insulating film 112 and the planarized second interlayer insulating film 114a. As exemplarily illustrated, when the first interlayer insulating film 112 is exposed, the height (thickness) of the dielectric film 115 can be reduced. Thus, the capacitance of the capacitor 306 can be secured. For example, the first interlayer insulating film 112 may be formed of a material that can be rapidly etched relative to a material of the second interlayer insulating film 114. Thus, when the first interlayer insulating film 112 is exposed, the first interlayer insulating film 112 can be rapidly etched. Thus, the capacitance of the capacitor 306 can be secured.

It will be appreciated that the thickness of the dielectric film 115 can be readily controlled according to process parameters. In FIGS. 9 through 12, the insulating film 106 has a substantially uniform thickness across the first region and the second region. However, if the thickness of the insulating film 106 in the second region is increased, the height of the capacitor lower electrode 108b is increased. As a result, the first interlayer insulating film 112 can be readily exposed in the planarizing process.

As depicted in FIG. 12, contact holes 116 are formed in the source region 210a and the drain region 210b by patterning the dielectric film 115 in the transistor region, and plugs 118 that bury the contact holes 116 are formed using a material including tungsten, or the like. The plugs 118 may be formed by, for example, depositing a tungsten film within the contact holes 116 and then planarizing the deposited tungsten film.

Figure 13:
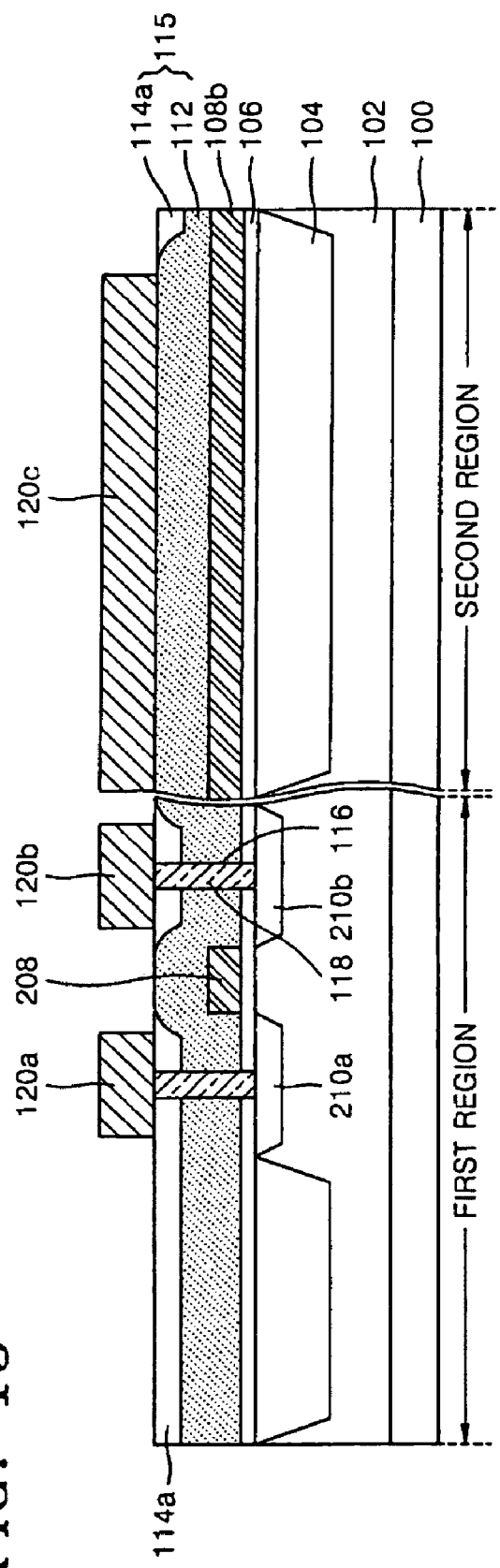

Referring to FIG. 13, a source line 120a and a drain line 120b, which are connected to the plugs 118 on the dielectric film 115 in the transistor region, and a capacitor upper electrode 120c on the dielectric film 115 in the capacitor region, are formed. The source line 120a, the drain line 120b, and the second electrode 120c include a metal and may be formed simultaneously in one manufacturing process.

As described above, in a non-volatile memory device according to embodiments of the present invention, a cell is formed by extending a floating gate into a capacitor region. Thus, in the non-volatile memory device, a capacitor is readily configured by using a floating gate as a capacitor lower electrode, an inter-gate dielectric film as a capacitor dielectric film, and a control gate as a capacitor upper electrode.

Also, in the non-volatile memory device according to embodiments of the present invention, a capacitor dielectric film is formed using first and second interlayer insulating films different from each other on the floating gate in the capacitor region, and the capacitance of the capacitor can be ensured through exposing the first interlayer insulating film formed under the second interlayer insulating film by planarizing the second interlayer insulating film.

As a result, when it a small capacity of memory is required, the non-volatile memory device according to embodiments of the present invention can be manufactured at low costs. In addition, since the cell structure is changed, a process for forming a capacitor is not added.

Embodiments of the present invention may be practiced in many ways. What follows below is a non-limiting discussion of some embodiments of the present invention.

According to an embodiment of the present invention, there is provided a non-volatile memory device comprising: an isolation film 1 that defines an active region on a semiconductor substrate; a tunnel insulating film formed on the active region; a control gate formed on the isolation film; a inter-gate dielectric film formed parallel to the control gate between the control gate and the isolation film; a floating gate which overlaps with the control gate below the inter-gate dielectric film and is extended to the tunnel insulating film on the active region; and a source region and a drain region formed in the active region on both sides of the floating gate.

The floating gate may comprise a head portion having a T shape and a leg portion located on the tunnel insulating film, and the control gate may be located in the T shape head portion of the floating gate. The control gate may be a capacitor upper electrode, the inter-gate dielectric film may be a capacitor dielectric film, and the floating gate is a capacitor lower electrode.

The capacitor upper electrode which is the control gate may be formed of a metal layer, the capacitor lower electrode which is a floating gate may be formed of a doped polysilicon film to form a capacitor having a metal M-inter-gate dielectric film I-polysilicon film P structure.

The non-volatile memory device may constitute a one time programmable (OTP) device or a multi time programmable (MTP) device.

According to another embodiment of the present invention, there is provided a non-volatile memory device comprising: a semiconductor substrate; an access transistor in which the floating gate formed on the semiconductor substrate and the control gate that controls the floating gate are stacked respectively interposing the tunnel insulating film and the inter-gate dielectric film, and the floating gate and the control gate constitute a spread capacitor structure; and a capacitor having a structure in which a capacitor lower electrode which is the same film as the floating gate and a capacitor upper electrode which is the same film as the control gate are stacked interposing a capacitor dielectric layer which is the same film as the inter-gate dielectric film between the capacitor lower electrode and the capacitor upper electrode.

According to another embodiment of the present invention, there is provided a non-volatile memory device comprising: an access transistor that comprises: a floating gate formed on a tunnel insulating film on a semiconductor substrate; and a first source region and a first drain region formed on both sides of the floating gate; a select transistor that comprises: a select gate which is structurally adjacent to the access transistor and is formed on a first gate insulating film on the semiconductor substrate; and a second source region and a second drain region formed on both sides of the select gate, wherein the second source region shares the first source region of the access transistor; and a capacitor that comprises: a capacitor lower electrode which is the same film as the floating gate of the access transistor and is formed on an insulating film on the semiconductor substrate; a capacitor dielectric film formed on the capacitor lower electrode; and a capacitor upper electrode formed on the capacitor dielectric film.

The floating gate may be formed of a polysilicon film doped with an impurity, and the capacitor upper electrode may be formed of a metal film. The control gate of the access transistor may be an element that performs as the capacitor upper electrode.

According to another embodiment of the present invention, a method of manufacturing a non-volatile memory device includes forming an insulating film overlapping a first region of a semiconductor substrate; forming a gate on the insulating film and forming a capacitor lower electrode overlapping a second region of the semiconductor substrate; forming a source region and a drain region in the first region of the semiconductor substrate at both sides of the gate; forming an inter-gate dielectric film on the semiconductor substrate having the gate and the capacitor lower electrode; patterning the inter-gate dielectric film to form a first contact hole exposing the source region and to form a second contact hole exposing the drain region; forming a first plug in the first contact hole and a second plug in the second contact hole; and forming a source line on the first plug, a drain line on the second plug and a capacitor upper electrode on the inter-gate dielectric film.

In one embodiment, forming the gate and the capacitor lower electrode may include forming a conductive layer on the insulating film and overlapping the second region of the semiconductor substrate; and patterning the conductive layer.

In one embodiment, the gate is a select gate.

In one embodiment, the gate is a floating gate extending to the second region of the semiconductor substrate.

In one embodiment, the gate includes polysilicon doped with an impurity and the capacitor upper electrode comprises metal.

In one embodiment, forming the inter-gate dielectric film may include sequentially forming a first interlayer insulating film and a second interlayer insulating on the semiconductor substrate having the gate and the capacitor lower electrode formed thereon, wherein the first interlayer insulating film comprises a material that is different a material of the second interlayer insulating film; and planarizing the second interlayer insulating film to expose a portion of the first interlayer insulating film.

In one embodiment, the planarizing is performed using a chemical mechanical polishing process and wherein the first interlayer insulating film comprises a material that can be etched at a faster rate than the material of the second interlayer insulating film when the portion of the first interlayer insulating film is exposed during the chemical mechanical polishing process.

While embodiments of the present invention have been exemplarily shown and described above, it will be understood by one of ordinary skill in the art that various changes in form and details may be made therein without departing from the spirit and scope of the present invention as defined by the following claims.

What is claimed is:

1. A non-volatile memory device comprising:
    an isolation film defining an active region in a semiconductor substrate;
    a tunnel insulating film located on the active region;
    a control gate located on the isolation film and in a first layer;
    a source line and drain line connected to the active region of the semiconductor substrate and formed in the same first layer as the control gate;
    an inter-gate dielectric film parallel to the control gate and located between the control gate and the isolation film;
    an electrode overlapped by the control gate and the inter-gate dielectric film, wherein the electrode extends over the tunnel insulating film on the active region to form a floating gate; and
    a source region and a drain region formed in the active region on both sides of the floating gate.

2. The non-volatile memory device of claim 1, wherein the electrode is T-shaped having a leg portion and a head portion, wherein the leg portion is located over the tunnel insulating film and wherein the control gate is located over the head portion of the electrode.

3. The non-volatile memory device of claim 1, wherein the control gate is a capacitor upper electrode, the inter-gate dielectric film is a capacitor dielectric film and the floating gate is a capacitor lower electrode.

4. The non-volatile memory device of claim 3, wherein the capacitor upper electrode which is the control gate formed of a metal layer, the capacitor lower electrode which is a floating gate formed of a doped polysilicon film to form a capacitor having a metal (M)-inter-gate dielectric (I)-polysilicon (P) structure.

5. The non-volatile memory device of claim 1, wherein the non-volatile memory device constitutes a one-time programmable (OTP) device or a multi-time programmable (MTP) device.

6. The non-volatile memory device of claim 1, further comprising first and second contacts that connect the source line and drain respectively to the source region and drain region.

7. The non-volatile memory device of claim 1, wherein the dielectric film is formed in a second layer directly below the first layer.

8. The non-volatile memory device of claim 7, wherein the electrode is formed in a third layer directly below the second layer.

9. The non-volatile memory device of claim 8, wherein the tunnel insulating film is formed in a fourth layer directly below the third layer.

* * * * *